US008931765B2

(12) United States Patent
Braman et al.

(10) Patent No.: US 8,931,765 B2
(45) Date of Patent: Jan. 13, 2015

(54) SYSTEMS AND METHODS FOR HIGH FREQUENCY ISOLATION

(71) Applicant: Honeywell Intl. Inc., Patent Services M/S AB/2B, Morristown, NJ (US)

(72) Inventors: Todd L. Braman, New Brighton, MN (US); Scott James Goepfert, White Bear Lake, MN (US)

(73) Assignee: Honeywell International Inc., Morristown, NJ (US)

( * ) Notice: Subject to any disclaimer, the term of this patent is extended or adjusted under 35 U.S.C. 154(b) by 122 days.

(21) Appl. No.: 13/628,911

(22) Filed: Sep. 27, 2012

(65) Prior Publication Data
US 2014/0085778 A1    Mar. 27, 2014

(51) Int. Cl.
*F16F 15/12*    (2006.01)
(52) U.S. Cl.
USPC ............................. 267/136; 74/574.4
(58) Field of Classification Search
USPC ............. 188/378; 73/493, 514.33; 267/136; 248/550, 562, 636, 638; 74/574.4
See application file for complete search history.

(56) References Cited

U.S. PATENT DOCUMENTS

| 5,878,980 | A | 3/1999 | Cooley, Jr. |
| 5,890,569 | A | 4/1999 | Goepfert |
| 6,578,682 | B2 | 6/2003 | Braman et al. |
| 7,166,911 | B2 | 1/2007 | Karpman et al. |
| 7,404,324 | B2 * | 7/2008 | Braman et al. ................. 73/493 |
| 2002/0113191 | A1 | 8/2002 | Rolt et al. |
| 2004/0150144 | A1 * | 8/2004 | Goepfert et al. .............. 267/136 |
| 2007/0113702 | A1 * | 5/2007 | Braman et al. ............... 74/574.4 |
| 2009/0166827 | A1 | 7/2009 | Foster et al. |
| 2010/0059911 | A1 | 3/2010 | Goepfert et al. |
| 2010/0251817 | A1 | 10/2010 | Ge et al. |
| 2010/0300201 | A1 | 12/2010 | Ge et al. |
| 2012/0085170 | A1 | 4/2012 | Letterneau |

FOREIGN PATENT DOCUMENTS

EP    1788277    5/2007
WO   9855832    12/1998

OTHER PUBLICATIONS

European Patent Office, "European Search Report for Application No. 13184467.2", "from Foreign Counterpart U.S. Appl. No. 13/628,911", Sep. 15, 2014, pp. 1-3, Published in: EP.

* cited by examiner

*Primary Examiner* — Christopher Schwartz
(74) *Attorney, Agent, or Firm* — Fogg & Powers LLC

(57) ABSTRACT

Systems and methods for providing vibration isolation for a MEMS device are provided. In at least one embodiment, a system comprises a first assembly and a second assembly, wherein the second assembly and the first assembly are joined together, enclosing the MEMS device, wherein the joined first assembly and the second assembly have a recessed groove formed on an interior surface. Further, the system comprises a rigid support encircling the MEMS device, the rigid support fitting within the recessed groove; and at least one mount isolator in contact with a plurality of surfaces of the rigid support, wherein the at least one mount isolator interfaces the plurality of surfaces of the rigid support with the first assembly and the second assembly, when the first assembly and the second assembly are joined together.

20 Claims, 7 Drawing Sheets

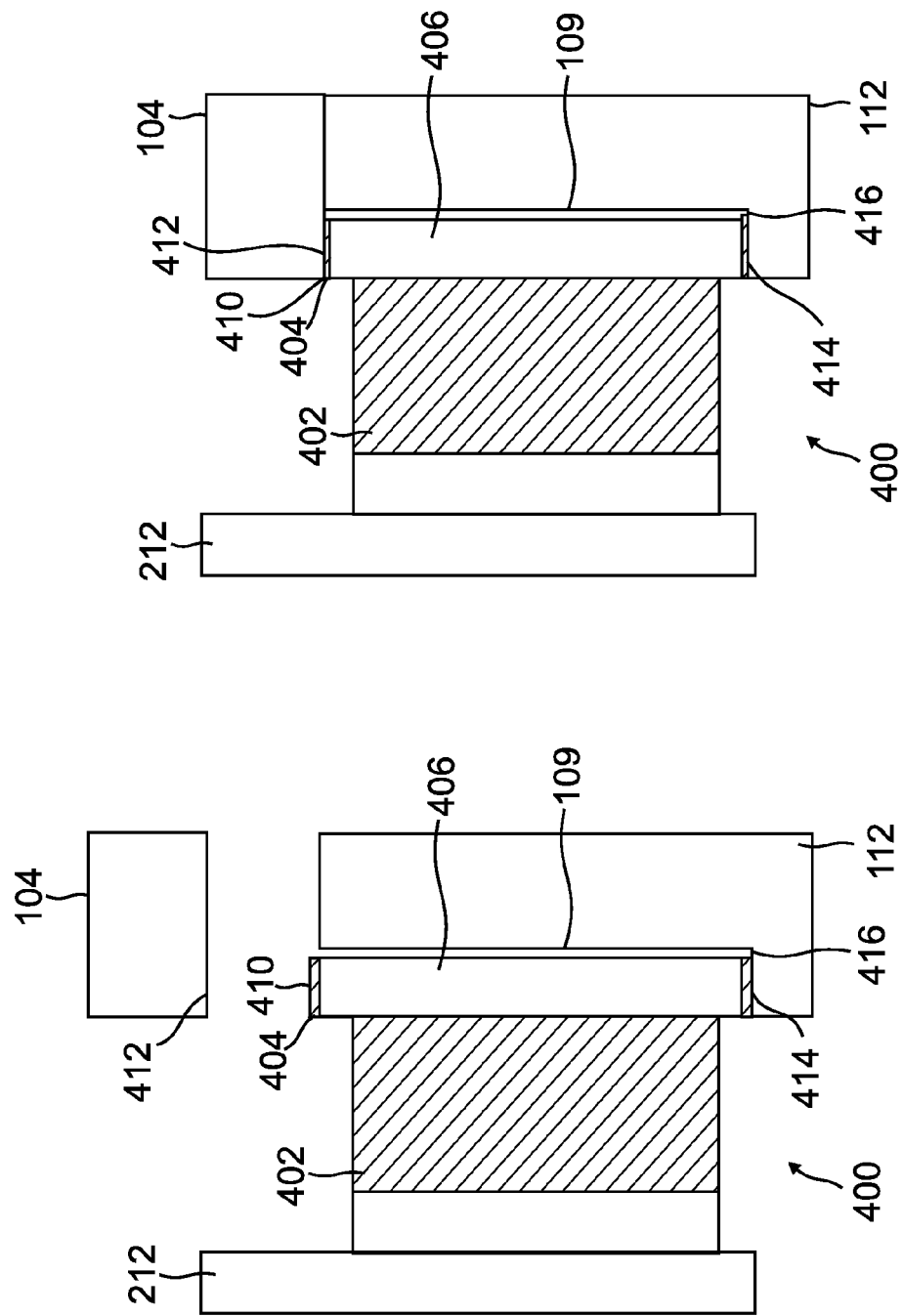

SYSTEMS AND METHODS FOR HIGH FREQUENCY ISOLATION

BACKGROUND

Vibration and shock inputs to electronic, mechanical, and electromechanical systems can degrade the performance and operational life of the systems. Micro Electrical Mechanical System (MEMS) devices exemplify one such system that is particularly sensitive to vibration and shock inputs. Frequently, to protect MEMS devices in harsh vibration environments, vibration isolators are commonly used to attenuate the effects of the vibrations. However, these vibration isolators are suboptimal for attenuating shock inputs that routinely accompany the vibrations in typical MEMS applications. For example, a MEMS inertial measurement unit that employs MEMS sensors often has critically sensitive frequencies that are higher than the frequencies attenuated by typical vibration isolators. When the MEMS device is subjected to these shocks at the high critically sensitive frequencies, the performance of the MEMS device degrades.

Further, MEMS devices are mounted within housing assemblies. As some MEMS devices are designed to provide precise measurements, the mounting within the housing assemblies are designed to precise tolerances to increase the accuracy of the measurements. Due to these precise tolerances, the housing assemblies and MEMS devices can be difficult to design and manufacture.

SUMMARY

Systems and methods for providing vibration isolation for a MEMS device are provided. In at least one embodiment, a system comprises a first assembly and a second assembly, wherein the second assembly and the first assembly are joined together, enclosing the MEMS device, wherein the joined first assembly and the second assembly have a recessed groove formed on an interior surface. Further, the system comprises a rigid support encircling the MEMS device, the rigid support fitting within the recessed groove; and at least one mount isolator in contact with a plurality of surfaces of the rigid support, wherein the at least one mount isolator interfaces the plurality of surfaces of the rigid support with the first assembly and the second assembly, when the first assembly and the second assembly are joined together.

DRAWINGS

Understanding that the drawings depict only exemplary embodiments and are not therefore to be considered limiting in scope, the exemplary embodiments will be described with additional specificity and detail through the use of the accompanying drawings, in which:

FIGS. 4A and 4B are diagrams illustrating the mounting of a MEMS device within a housing assembly in one embodiment described in the present disclosure;

Figure 1:
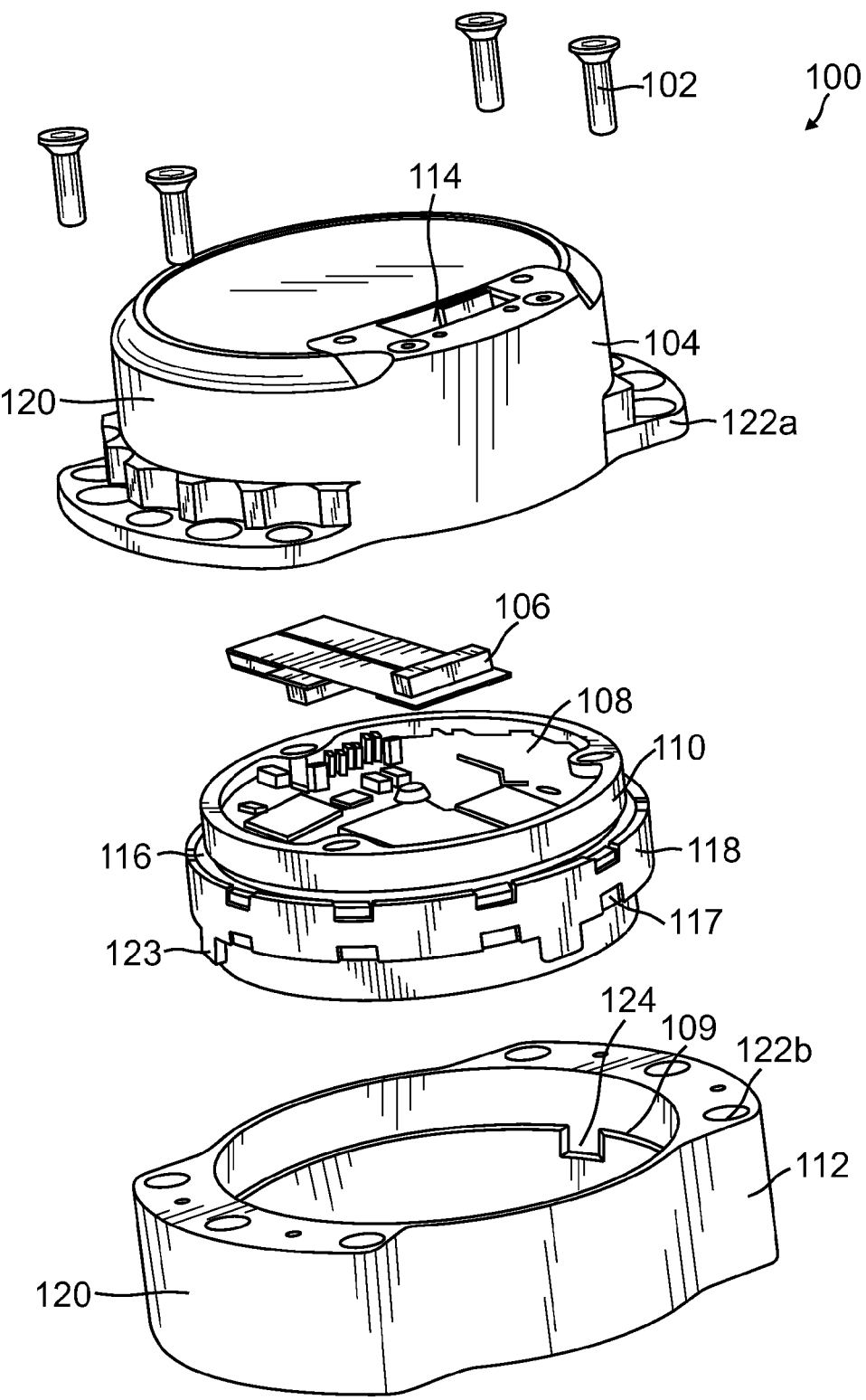
FIG. 1 is an exploded view of a housed MEMS device in one embodiment described in the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

A high frequency mount isolator can be molded, coated, or assembled between a rigid support of a MEMS device and the housing assembly enclosing the MEMS device. The mount isolator can be tuned to improve attenuation of high frequency shocks and vibrations that affect the performance of the MEMS device. In certain embodiments, the mount isolator can function with a vibration isolator assembled between the rigid support of the MEMS device and the MEMS device itself. The combination of the mount isolator and the vibration isolator provide a dual stage isolation system where the combination of the vibration isolator and the mount isolator is tuned to attenuate shocks and vibrations in both a lower frequency region and a higher frequency region.

FIG. 1 is an exploded view of a housed MEMS device 100, where a housing assembly 120 encloses an isolated MEMS device 108. In certain embodiments, the isolated MEMS device 108 functions as an inertial sensor assembly (ISA) and includes devices such as accelerometers and gyroscopes. For example, the MEMS device 108 includes three accelerometers that aid in measuring acceleration along three orthogonal axes and three gyroscopes that provide measurements of rotation about three orthogonal axes. When the MEMS device 108 functions as an ISA, the inertial sensors provide inertial data, such as linear acceleration and angular rate information, to a navigation computer onboard an aircraft or other moving vehicle. The navigation computer processes the data for flight control and/or navigation of the aircraft. While MEMS device 108 can provide inertial data to a navigational computer when the MEMS device 108 is an ISA, vehicle maneuvers (such as acceleration, changes in pitch, roll and yaw, takeoff and landing), turbulence, and engine operation generate shocks and vibrations that are conveyed through the vehicle to a housing assembly 120 enclosing the ISA. The shocks and vibrations may cause linear or angular acceleration errors and angular rate errors in inertial data provided by the ISA to the navigational computer.

In certain embodiments, to prevent the shocks and vibrations from causing linear or angular acceleration or angular rate errors in the data provided by the MEMS device 108, the MEMS device 108 is mounted within the housing assembly 120 through at least one mount isolator 118 and a frequency vibration isolator 116 that attenuates the effects of shocks and vibrations on the MEMS device 108. The mount isolator 118 is designed to prevent rigid structures of the housing assembly 120 from contacting a rigid support 117 that supports the MEMS device 108 within the housing assembly. Further, in certain embodiments, the mount isolator 118 attenuates the effects of high frequency shocks and vibrations on the MEMS device 108 and the vibration isolator 116 attenuates the effects of low frequency shocks and vibrations on the MEMS device 108. In contrast, the mount isolator 118 can attenuate the effects of low frequency shocks and vibrations on the MEMS device 108 and the vibration isolator 116 attenuates the effects of high frequency shocks and vibrations on the MEMS device 108. In alternative embodiments, MEMS device 108 connects directly to a rigid support 117 coated by the mount isolator 118 without an interceding vibration isolator 116. In at least one embodiment, a retainer ring 110 secures the components of the MEMS device 108 to the vibration isolator 116 and the mount isolator 118.

The housing assembly 120 containing the MEMS device 108 includes both a first assembly 104 and a second assembly 112. Both the first assembly 104 and the second assembly 112 connect to each other to enclose and protect the MEMS device 108 while providing a mounting interface 122a and 122b to a larger navigational system. For example, a mounting interface 122a and 122b may include a flange through which the housing assembly 120 is bolted to another system. In at least one embodiment, the first assembly 104 and the second assembly 112 are placed against each other and then secured to one another through a series of bolts 102. In at least one implementation, an O-ring may be placed between the first assembly 104 and the second assembly 112 such that when the bolts 102 secure the first assembly 104 against the second assembly 112, the O-ring is pressed and flows to form a seal that protects devices within the housing assembly 120.

In certain embodiments, the second assembly 112 has a groove 109 formed therein to receive the mount isolator 118 that encircles the MEMS device 108. In an alternative embodiment, the groove 109 is formed in a combination of the first assembly 104 and the second assembly 112. Further, the groove is formed only in the first assembly 104. The mount isolator 118 is secured in the groove between the first assembly 104 and the second assembly 112 when the first assembly 104 and the second assembly 112 are joined together. In at least one implementation, the groove 109 includes a keyed section 124 that receives a key portion 123 of the mount isolator 118. The key portion 123 fits into the keyed section 124 when the mount isolator 118 is placed within the groove 109 to prevent rotation of the MEMS device 108 within the housing assembly 120.

In at least one implementation, to secure the mount isolator 118 between the first assembly 104 and the second assembly 112, both the first assembly 104 and the second assembly 112 apply pressure to the mount isolator 118 such that when bolts 102 tighten the first assembly 104 against the second assembly 112, the rigid support 117 and mount isolator 118 become securely disposed within the housing assembly 120. By securing the rigid support 117 and mount isolator 118 between the first assembly 104 and the second assembly 112, the MEMS device 108 is secured within the connected first assembly 104 and the second assembly 112. The pressure applied to the mount isolator 118 due to the fastening of the first assembly 104 to the second assembly 112 is described in greater detail below with regards to FIG. 3

In a further embodiment, the MEMS device 108 electrically communicates with an external system or device by providing electronic signals through an electrical connection 106 that electrically connects the MEMS device 108 to an external interface 114 for transmitting and receiving electrical signals from the external system or device such as a navigational computer. In at least one embodiment, the electrical connection 106 includes flex tape, a series of wires, and the like. Due to the electrical connection 106, the MEMS device 108 is able to communicate with an external system while being isolated within the housing assembly 120. Thus, the MEMS device 108 is isolated within the conjoined first assembly 104 and second assembly 112, which first assembly 104 and second assembly 112 apply pressure to the rigid support 117 via the mount isolator 118. Further, as the rigid support 117 is connected to the MEMS device 108 via the vibration isolator 116, the MEMS device 108 is securely disposed within the housing assembly 120. Due to the vibration and shock isolation and the secure location within the housing assembly 120, the MEMS device 108 is less susceptible to both high and low frequency shocks and vibrations.

Figure 2:
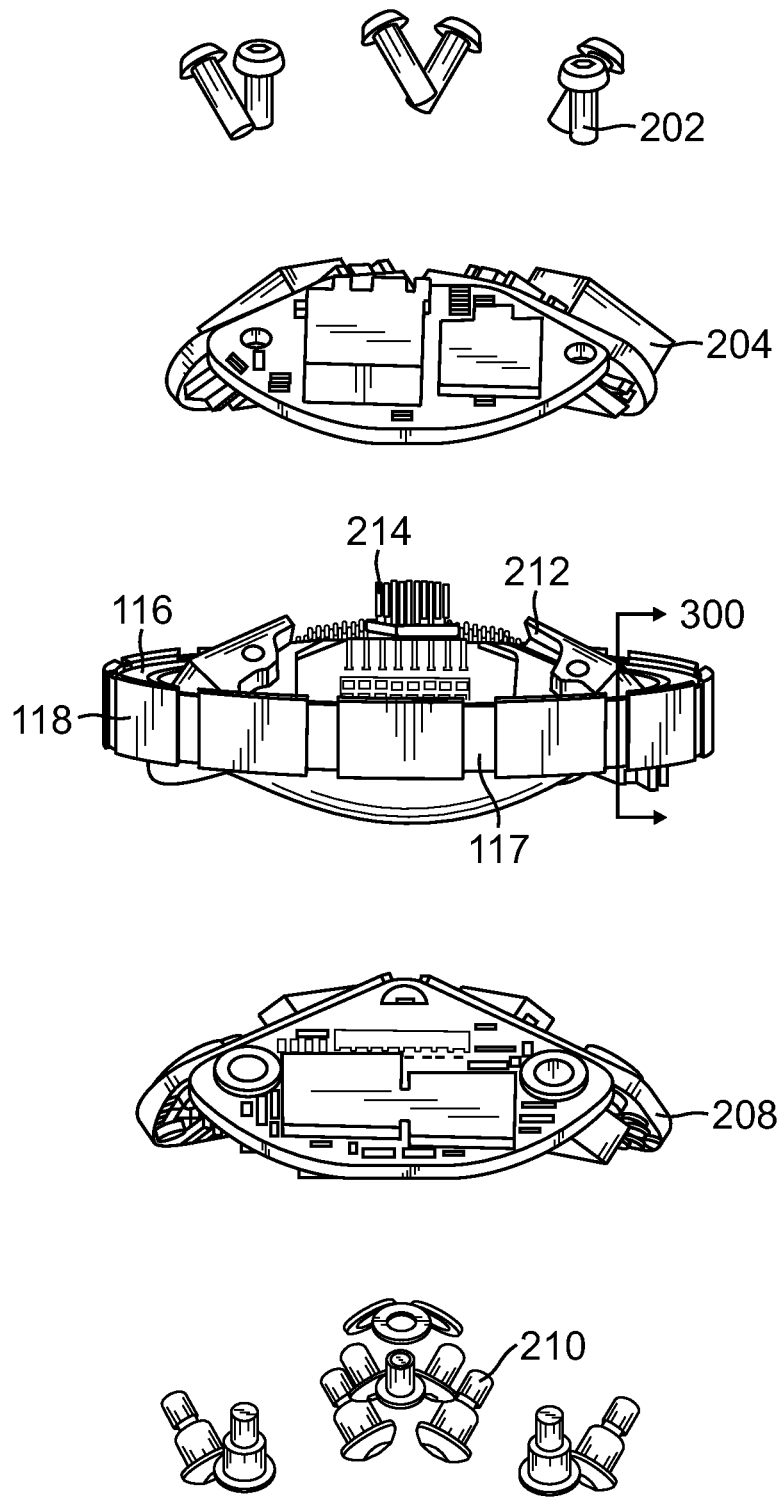
FIG. 2 is an exploded view of vibration isolated inertial sensors in one embodiment described in the present disclosure.

FIG. 2 is an exploded view of one embodiment of an isolated MEMS device 200. For example, the vibration isolator 116 may be a ring shaped elastomeric member that encircles an ISA mount 212. In certain embodiments, the vibration isolator 116 functions together with the mount isolator 118 on the rigid support 117 to provide a dual stage shock and vibration isolator that protects components joined to the ISA mount 212 from both high and low frequency shocks and vibrations. The ISA mount 212, as described herein, may connect to both an accelerometer assembly 204 and a gyroscope assembly 208. A series of accelerometer mounting bolts 202 may secure the accelerometer assembly 204 to the ISA mount 212. Likewise, a series of gyroscope bolts 210 may secure the gyroscope assembly 208 to the ISA mount 212.

In at least one embodiment, the accelerometer assembly 204 includes at least three accelerometers that are capable of measuring acceleration along three different axes. Similarly, the gyroscope assembly 208 includes at least three gyroscopes that are capable of measuring rotation about three different axes. Further, the ISA mount 212 provides an external connection 214 to both the accelerometer assembly 204 and the gyroscope assembly 208, where the external connection 214 provides an electrical transmission path between both the accelerometer assembly 204 and the gyroscope assembly 208, where the external connection 214 enables an external system to electrically connect through the first assembly 104 in FIG. 1 and the electrical connection 106 to receive signals from both the accelerometer assembly 204 and the gyroscope assembly 208.

In certain embodiments, where both the accelerometer assembly 204 and the gyroscope assembly 208 are joined to the ISA mount 212, the combination of the vibration isolator 116 and the mount isolator 118 protect both the accelerometer assembly 204 and the gyroscope assembly 208 from shocks and vibrations that affect the first assembly 104 and the second assembly 112 in FIG. 1. Further, the combination of the vibration isolator 116 and the mount isolator 118 protect both the accelerometer assembly 204 and the gyroscope assembly 208 from low and high frequency shocks and vibrations. In an alternative embodiment, only a mount isolator 118 protects the accelerometer assembly 204 and the gyroscope assembly 208 from shocks and vibrations that affect the first assembly 104 and the second assembly 112 in FIG. 1. When only the mount isolator 118 protects against shocks and vibrations, the ISA mount 212 directly connects to the rigid support 117.

Figure 3:
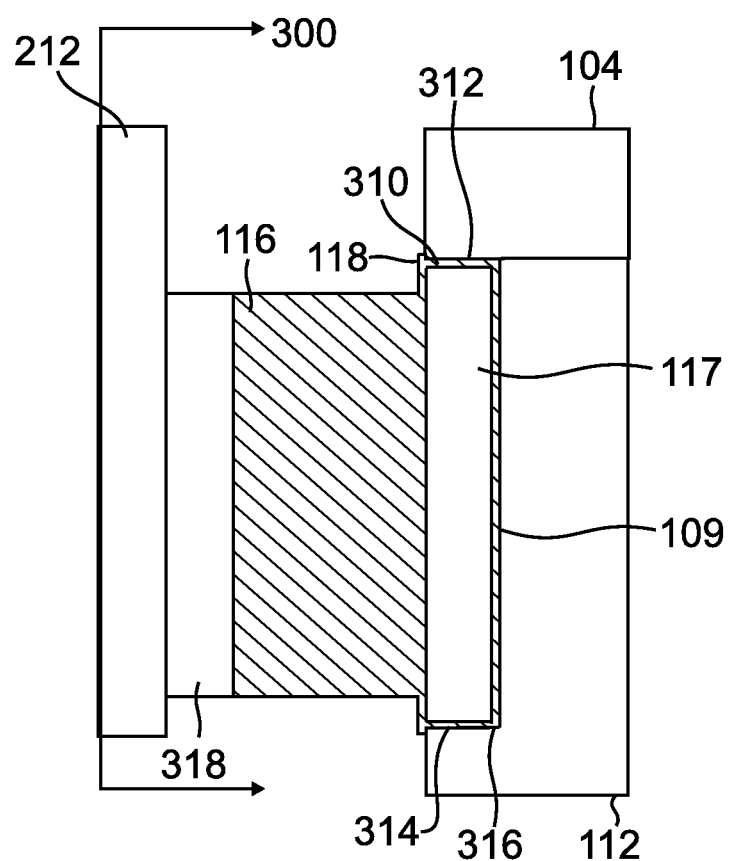
FIG. 3 is a cross sectional view of the interface between a MEMS device and a housing assembly in one embodiment described in the present disclosure.

FIG. 3 is a cross sectional view 300 of the ISA mount 212 described in FIG. 2 that illustrates how the ISA mount 212 is secured between the conjoined first assembly 104 and second assembly 112 described in FIG. 1. In certain embodiments, ISA mount 212 interfaces with both the first assembly 104 and the second assembly 112 through the combination of the vibration isolator 116, the rigid support 117 and the mount isolator 118. For example, rigid support 117 connects to ISA mount 212, such that when rigid support 117 is secured within the conjoined first assembly 104 and second assembly 112, the ISA mount 212 is secured with respect to the first assembly 104 and the second assembly 112. In certain embodiments, the rigid support 117 is connected to a mount isolator 118. The mount isolator 118 functions to prevent rigid surfaces of the rigid support 117 from contacting rigid surfaces of the first assembly 104 and the second assembly 112. By preventing the surfaces of the rigid support 117 from contacting rigid surfaces of the first assembly 104 and the second assembly 112, the mount isolator 118 attenuates high frequency shocks and vibrations that affect the first assembly 104 and the second assembly 112. In at least one embodiment, the mount isolator 118 is fabricated from an elastomeric material or other material that is capable of attenuating high frequency shocks and vibrations. In at least one implementation, the mount isolator 118 and the vibration isolator 116 are fabricated from the same elastomeric material.

In certain embodiments, the rigid support 117 connects to the ISA mount 212 through a vibration isolator 116 that encircles the ISA mount 212. In at least one implementation, the vibration isolator 116 attenuates shocks and vibrations in a lower frequency region than the shocks and vibrations attenuated by the mount isolator 118. The vibration isolator 116 is described in detail in U.S. Pat. No. 5,890,569 entitled "VIBRATION ISOLATION SYSTEM FOR AN INERTIAL SENSOR ASSEMBLY" filed on Jun. 6, 1997, herein incorporated in its entirety by reference and referred to herein as the '569 patent.

In certain embodiments, the vibration isolator 116 interfaces with the ISA mount 212 through an inner member 318, where the inner member encircles the ISA mount 212 and is encircled by and is concentric with the vibration isolator 116. In certain implementations, the inner member 318 includes radially extending ridges that extend into the vibration isolator 116, where the ridges increase the surface area of the inner member 318 that is available to affix to the vibration isolator 116. In a further implementation, the vibration isolator 116 can include cutout regions that are concentric with the rigid support 117 and the inner member 318, the cutout regions are further described in the '569 patent. The shape of the cutout regions provide flexibility to the vibration isolator 116, where the flexibility aids in damping and absorbing unwanted shock and vibration energy transmitted through the rigid support 117.

In at least one embodiment, the rigid support 117 and the inner members 318 are manufactured of an aluminum alloy or other rigid material. In certain embodiments, both the vibration isolator 116 and the mount isolator 118 are formed by the injection molding. For example, a silicone rubber elastomeric material is injection molded under high temperature and pressure into a cavity between the rigid support 117 and the inner members 318 and around the rigid support 117. The silicone rubber material bonds to the surfaces of the rigid support 117 and the inner member 318, which silicone rubber material holds the rigid support 117 to the inner member 318. In at least one implementation, the vibration isolator 116 and the mount isolator 118 are contiguously formed around the rigid support 117 as shown in FIG. 3. In an alternative embodiment, the mount isolator 118 is not contiguously formed with the vibration isolator 116 as shown in FIGS. 4A and 4B.

In certain embodiments, to secure the rigid support 117 and the mount isolator 118 with respect to the first assembly 104 and the second assembly 112. The rigid support 117 and mount isolator 118 are inserted within a groove 109 formed within the second assembly 112. The second assembly 112 includes a second assembly surface 316 that contacts a second mount isolator surface 314. Also, the first assembly 104 includes a first assembly surface 312 that contacts a first mount isolator surface 310. As shown in FIG. 3, the second assembly surface 316 is the surface of the groove 308 formed within the second assembly 112 that is farthest from the first assembly 104. Also, the first assembly surface 312 is the surface of the first assembly 104 that is substantially parallel to and also nearest to the second assembly surface 316 when the first assembly 104 and the second assembly are joined to one another. The first mount isolator surface 310 and the second mount isolator surface 314 respectively face the first assembly surface 312 and the second assembly surface 316. Further, the first mount isolator surface 310 and the second mount isolator surface 314 are located on opposite faces of the rigid support 117. In certain embodiments, the combination of the mount isolator 118 and rigid support 117 are secured with respect to the joined first assembly 104 and the second assembly 112 by force applied against the first mount isolator surface 310 by the first assembly surface 312 and by force applied against the second mount isolator surface 314 by the second assembly surface 316. Because the first assembly surface 312 and the second assembly surface 316 face each other, the force applied by the first assembly 104 against the mount isolator 118 and the force applied by the second assembly 112 against the mount isolator 118 are in opposite directions. The opposing forces fix the mount isolator 118 and rigid support 117 within the groove 308 formed in the second assembly 112.

FIGS. 4A and 4B illustrate the securing of the position of an ISA mount 212 with respect to a first assembly 104 and second assembly 112. The ISA mount 212 is joined to the vibration isolator 402, which is in turn joined to the rigid support 406. In contrast to the example described in relation to FIG. 3, where the vibration isolator 116 and the mount isolator 118 were contiguously formed around the rigid support 117, in certain embodiments, as shown in FIGS. 4A and 4B, a mount isolator 404 is only in contact with the surfaces of the rigid support 406 that are orthogonally oriented to the surface of the rigid support 406 that is in contact with the vibration isolator 402. In FIG. 4A, the ISA mount 212, the vibration isolator 402, the rigid support 406, and the mount isolator 404, are inserted into a groove 109 formed in the second assembly 112. When the ISA mount 212 and vibration isolators are inserted into the groove 109, the second mount isolator surface 414 is placed against the second assembly surface 416, where the second mount isolator surface 414 and the second assembly surface 416 function as second mount isolator surface 314 and second assembly surface 316 described in relation to FIG. 3. In at least one embodiment, due to the elastomeric quality of the mount isolator 404, the groove 109 and rigid support 406 can be designed according to relaxed tolerances as the compression of the mount isolator 404 causes the mount isolator 404 to flow between the rigid support 406 and the surfaces of the first assembly 104 and the second assembly 112 in the groove 109.

As illustrated in FIG. 4A, when the ISA mount 212 and the vibration isolators are inserted into the groove 109, the second assembly 112 is not in contact with the first assembly 104. In certain embodiments, as illustrated in FIG. 4B, the first assembly 104 is joined to the second assembly 112 such that a first assembly surface 412 comes into contact with the first mount isolator surface 410, where the first assembly surface 412 and the first mount isolator surface 410 function as the first assembly surface 312 and the first mount isolator surface 310 in FIG. 3. When the first assembly 104 is brought into contact with the second assembly 112, the mount isolator 404 is compressed such that the mount isolator 404 flows around the edges of the first assembly surface 412 and the second assembly surface 416. Further, when there is no mount isolator formed on the distal surface of the rigid support 406 that is farthest from the ISA mount 212, a portion of the mount isolator 404 flows around the distal surface of the rigid support 406 to prevent the surfaces of the second assembly 112 from contacting the rigid support 406. As the mount isolator 404 is compressed between the first assembly 104, the second assembly 112, and the rigid support 406, the compressive force on the mount isolator 404 holds the ISA mount 212 securely within the space enclosed by the joined first assembly 104 and the second assembly 112.

Figure 5A:
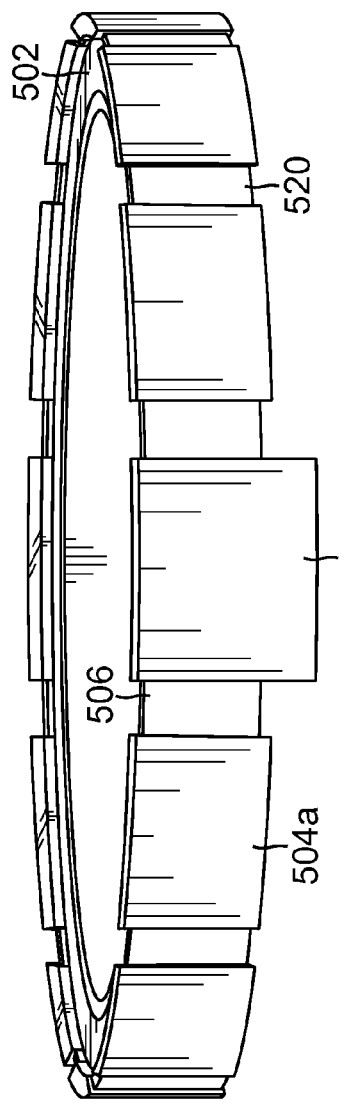
FIGS. 5A and 5B are diagrams of a mount isolator in multiple embodiments described in the present disclosure.
Figure 5B:
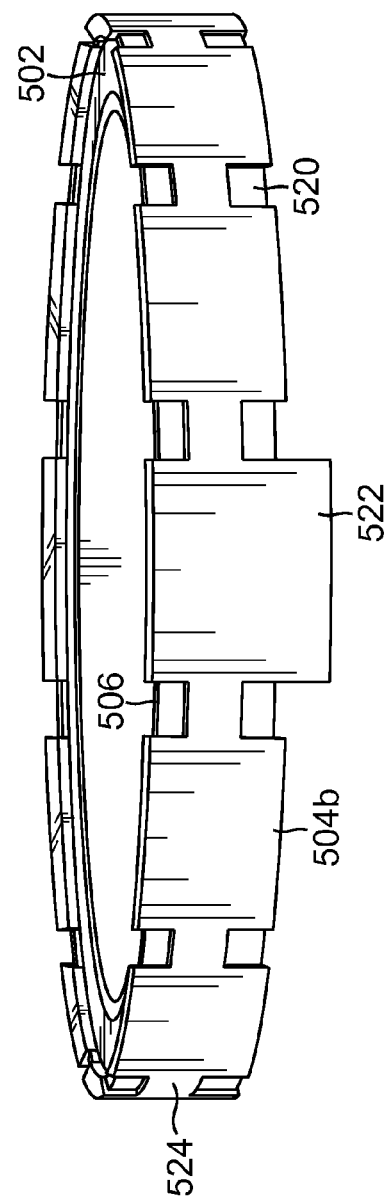

FIGS. 5A and 5B illustrate different embodiments of mount isolators 504. As described above, the combination of the mount isolators 504 and the vibration isolator 502 provide a dual stage frequency response. For example, the vibration isolator 502 attenuates the effects of shocks and vibration that are in a lower frequency range, while the mount isolator 504 attenuates the effects of shocks and vibration that are in a higher frequency range. Further, the frequency response of the mount isolator 504 can be controlled by altering the characteristics of the mount isolator 504 and the compressive force that is applied to the mount isolator 504 by the first assembly 104 and the second assembly 112. For example, characteristics of the mount isolator 504 that can be altered to control the frequency response of the mount isolator 504 include the thickness, shape, and rigidity of the mount isolator 504. As the characteristics are changed, the frequency response is determined by how rigidly secure the mount isolator 504 is within the housing assembly 120. For example, as the thickness increases of the mount isolator 504, the first assembly 104 and the second assembly 112 can compress the mount isolator 504 with greater pressure. The increase in pressure causes the mount isolator 504 to respond to higher frequencies. Likewise, an increase in the rigidity also causes the mount isolator 504 to respond to higher frequencies. Generally, as the characteristics of the mount isolator 504 change to stiffen the mount isolator 504, the mount isolator 504 will respond to higher frequencies.

As illustrated in FIG. 5A, the mount isolator 504a exposes portions 520 of the rigid support 506 at intervals as the mount isolator 504a extends around the rigid support 506. In certain embodiments, the mount isolator 504a is removed at the exposed portions 520 of the rigid support 506. Alternatively, the mount isolator 504a is thinner at the exposed portions 520 of the rigid support 506 than at the non-exposed portions of the rigid support 506. Further, the frequency response of the mount isolator 504a is a square function of the area covered by the exposed portions.

FIG. 5B illustrates a mount isolator 504b that includes a central isolator band 524 that extends around the rigid support 506 and through the exposed portions 520 of the rigid support 506. The central isolator band 524 can further change the frequency response of the mount isolator 504b. Further, the central isolator band 524 prevents the exposed portions of the rigid support 506 from coming into contact with metal surfaces on the first and second assemblies 104 and 112 that contain the mount isolator 504b. In certain embodiments, when metal surfaces on the first and second assemblies come into contact with the rigid support 506, the ability of the mount isolator 504b to attenuate shocks and vibrations becomes decreased. Further, in certain embodiments, the central isolator band 524 is separated from metal surfaces on the first and second assemblies 104 and 112 by an air gap, where the air gap is maintained by pressed portions of the mount isolator 504b that are located on surfaces that are orthogonal to the surface in contact with the central isolator band 524.

As illustrated in both FIGS. 5A and 5B, a mount isolator 504 can include a key portion 522. As used herein, the phrase "key portion" refers to a portion of the mount isolator that is larger than surrounding portions of the mount isolator. In certain embodiments, a groove formed in either or both of a first assembly and second assembly (such as first assembly 104 and second assembly 112) may have a keyed section that is recessed according to the shape of the key portion 522. When the rigid support 506 and mount isolator 504 are inserted into the groove, the key portion 522 is located within the keyed section of the groove such that an ISA mount is placed at the same angular location within a housing assembly when the first assembly and the second assembly are joined together, where the housing assembly, first assembly, and second assembly function as the housing assembly 120, first assembly 104, and second assembly 112 in FIG. 1. Further the key portion 522 inhibits the rotation of the ISA mount within the housing assembly.

Figure 6:
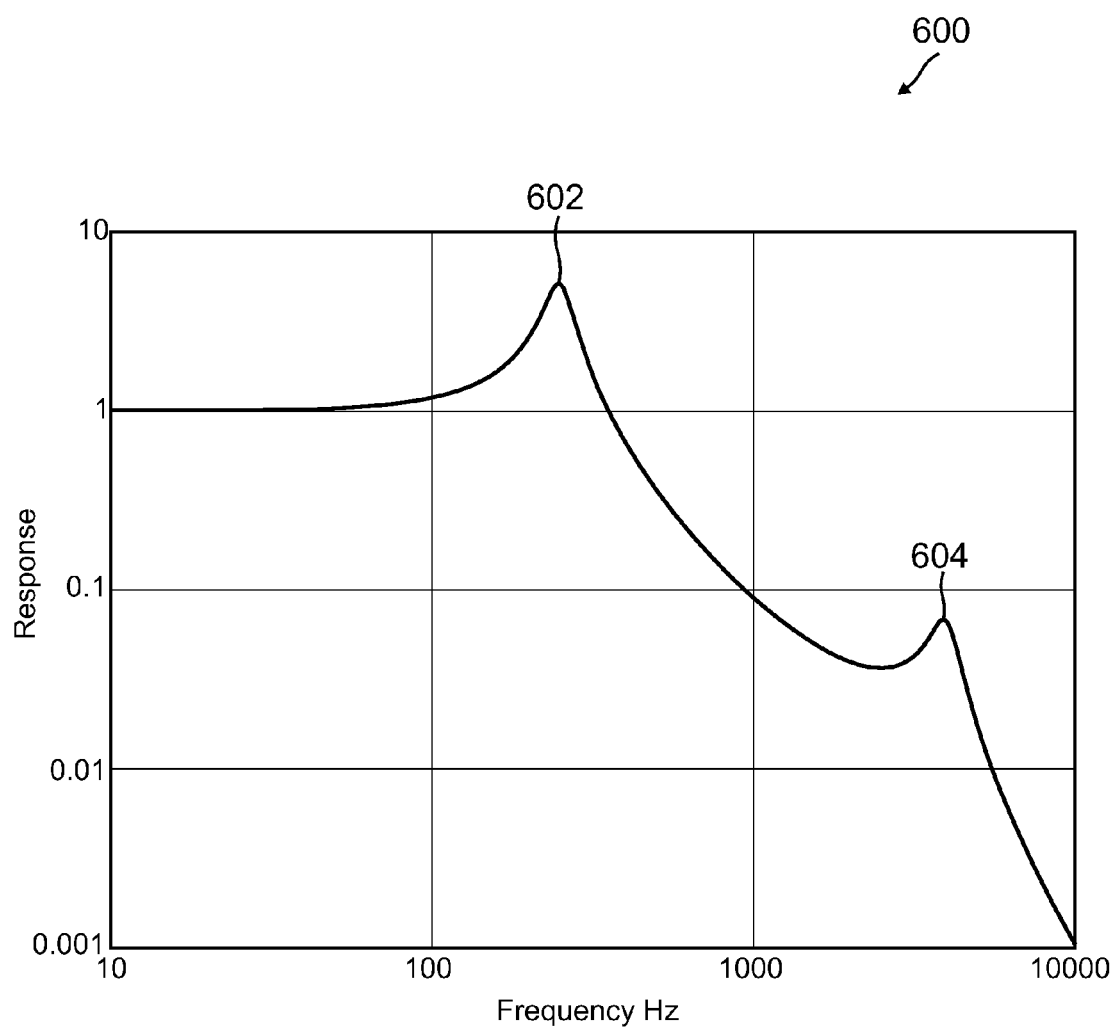
FIG. 6 is a graph illustrating the frequency response to shocks and vibrations of a MEMS device mounted within a housing assembly in one embodiment described in the present disclosure.

FIG. 6 is a graph 600 of the frequency response of the combination of a vibration isolator and a mount isolator. As illustrated, the graph 600 has two peaks, a first peak 602 and a second peak 604. The first peak 602 corresponds to the frequency response of a vibration isolator. The second peak 604 corresponds to the frequency response of a mount isolator. As illustrated in graph 600, the first peak 602 amplifies signals around 250 Hz and attenuates signals above 250 Hz, the signals are amplified at 250 Hz because 250 Hz is the natural frequency of the vibration isolator. However, as the frequency of the shocks and vibrations increases, the ability to attenuate shocks and vibrations of the vibration isolator, illustrated as first peak 602, decreases. The mount isolator amplifies signals around 4 kHz but attenuates signals above 4 kHz such that high frequency shocks and vibrations are inhibited from affecting the operation of MEMS devices that are isolated by the mount isolator and the vibration isolator. In an alternative embodiment the first peak 602 corresponds to the frequency response of the mount isolator and the second peak 604 corresponds to the frequency response of the vibration isolator.

Figure 7:
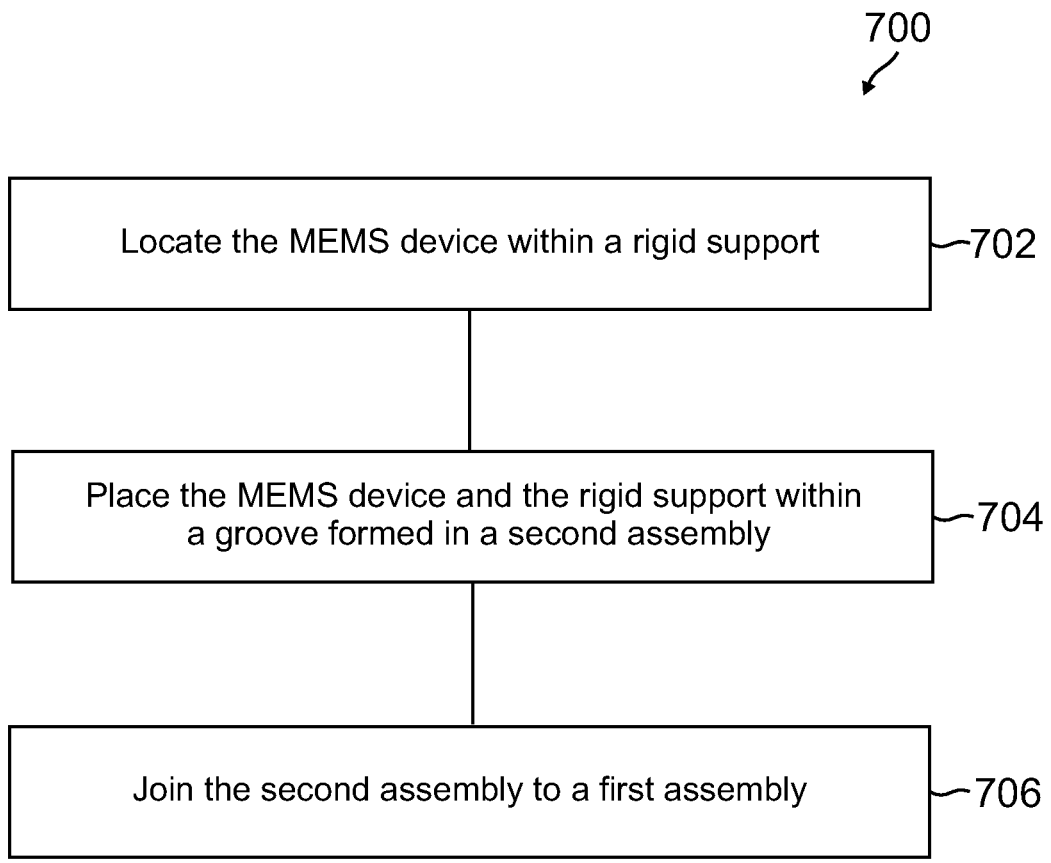
FIG. 7 is a flow diagram of a method for mounting a MEMS device within a housing assembly in one embodiment described in the present disclosure.

FIG. 7 is a flow diagram of a method 700 for securing a mount isolator within a housing assembly. Method 700 proceeds at 702 where a MEMS device is located within a rigid support. For example, the MEMS device is located within a rigid support having multiple surfaces that are in contact with a mount isolator. In certain embodiments, the mount isolator includes an elastomeric layer formed on surfaces of the rigid support. Method 700 proceeds at 704 where the MEMS device and the rigid support are placed within a groove formed in a second assembly. For example, the rigid support extends circumferentially around the MEMS device and slides into a groove formed in the interior surface of the second assembly.

Method 700 proceeds at 706, where the second assembly is joined to a first assembly. For example, the first assembly and the second assembly are two parts of a housing assembly that encloses the MEMS device and the rigid support. When the second assembly and the first assembly are joined together, both the first assembly and the second assembly apply pressure to the mount isolator formed on the rigid support such that the rigid support and the MEMS device are secured with respect to the joined first assembly and second assembly.

Example Embodiments

Example 1 includes a system for providing vibration isolation for a MEMS device, the system comprising: a first assembly; a second assembly, wherein the second assembly and the first assembly are joined together, enclosing the MEMS device, wherein the joined first assembly and the second assembly have a recessed groove formed on an interior surface; a rigid support encircling the MEMS device, the rigid support fitting within the recessed groove; and at least one mount isolator in contact with a plurality of surfaces of the rigid support, wherein the at least one mount isolator interfaces the plurality of surfaces of the rigid support with the first assembly and the second assembly, when the first assembly and the second assembly are joined together.

Example 2 includes the system of Example 1, wherein the rigid support is connected to the MEMS device via a vibration isolator.

Example 3 includes the system of Example 2, wherein the at least one mount isolator and the vibration isolator are connected to each other.

Example 4 includes the system of any of Examples 1-3, wherein the plurality of surfaces of the rigid support comprise: a distal surface, wherein the distal surface is the surface of the rigid support that is farthest from the MEMS device, the distal surface encircling the MEMS device; a first mount isolator surface having a first segment of the at least one mount isolator formed thereon; and a second mount isolator surface having a second segment of the at least one mount isolator formed thereon, wherein the first mount isolator surface and the second mount isolator surface are parallel to one another and intersect opposite edges of the distal surface.

Example 5 includes the system of Example 4, wherein a further segment of the at least one mount isolator is formed on the distal surface.

Example 6 includes the system of any of Examples 4-5, wherein the rigid support is secured between the first assembly and the second assembly through pressure applied by the first assembly on the first segment of the at least one mount isolator and pressure applied by the second assembly on the second segment of the at least one mount isolator.

Example 7 includes the system of Example 6, wherein the pressure applied to the first segment of the at least one mount isolator and the second segment of the at least one mount isolator causes a portion of the first segment and the second segment to flow over a portion of the distal surface.

Example 8 includes the system of any of Examples 4-7, wherein an exposed portion of the rigid support that faces the first assembly and the second assembly are not in contact with the at least one mount isolator.

Example 9 includes the system of Example 8, wherein the exposed portion comprises a plurality of exposed strips that are periodically located around the circumference of the rigid support, wherein an exposed strip extends around the first surface, the second surface, and the distal surface.

Example 10 includes the system of Example 9, wherein a central isolator band extends around the circumference of the rigid support, where the central isolator band is in contact with a portion of the distal surface that is centrally located between the edges of the distal surface.

Example 11 includes the system of any of Examples 1-10, wherein the recessed groove is formed on an interior surface of the second assembly.

Example 12 includes the system of any of Examples 1-11, wherein the at least one mount isolator comprises at least one key portion, wherein the at least one key portion is larger than surrounding portions of the at least one mount isolator, wherein the recessed groove comprises at least one keyed section that receives the at least one key portion of the at least one mount isolator.

Example 13 includes an apparatus for attenuating vibrations for a MEMS device, the apparatus comprising: a vibration isolator connected to and encircling the MEMS device; a rigid support coupled to the vibration isolator, the rigid support encircling the vibration isolator, wherein the rigid support comprises: a distal surface, wherein the distal surface is the surface of the rigid support that is farthest from the MEMS device, the distal surface encircling the MEMS device; a first mount isolator surface having a first segment of at least one mount isolator formed thereon, wherein the at least one mount isolator and the vibration isolator attenuate shocks and vibrations in different frequency ranges; and a second mount isolator surface having a second segment of the at least one mount isolator formed thereon, wherein the first surface and the second surface are parallel to one another and intersect opposite edges of the distal surface.

Example 14 includes the apparatus of Example 13, wherein the at least one isolator covers a portion of the distal surface.

Example 15 includes the apparatus of any of Examples 13-14, wherein the at least one mount isolator is formed from an elastomeric material.

Example 16 includes the apparatus of any of Examples 13-15, wherein an exposed portion of the first surface, the second surface, and the distal surface are not in contact with the at least one isolator.

Example 17 includes the apparatus of any of Examples 13-16, wherein the vibration isolator connects to the MEMS device via an inner member that encircles the MEMS device.

Example 18 includes a method for attenuating vibration for a MEMS device, the method comprising: locating the MEMS device within a rigid support, wherein a plurality of surfaces of the rigid support are in contact with at least one mount isolator; placing the MEMS device and the rigid support within a groove formed in a second assembly; joining the second assembly to a first assembly, wherein both the first assembly and the second assembly apply pressure to the at least one mount isolator such that the location of the rigid support is secured with respect to the joined first assembly and second assembly.

Example 19 includes the method of Example 18, further comprising adjusting at least one of the hardness, thickness, and coverage area of the at least one mount isolator to attenuate frequencies within a certain frequency range.

Example 20 includes the method of Example 19, wherein the at least one mount isolator attenuates frequencies greater than 2000 Hz.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system for providing vibration isolation for a MEMS device, the system comprising:
    a first assembly;
    a second assembly, wherein the second assembly and the first assembly are joined together, enclosing the MEMS device, wherein the joined first assembly and the second assembly have a recessed groove formed on an interior surface;
    a rigid support encircling the MEMS device, the rigid support fitting within the recessed groove; and
    at least one mount isolator in contact with a plurality of surfaces of the rigid support, wherein the at least one mount isolator interfaces at least one first surface of the plurality of surfaces of the rigid support with the first assembly and at least one second surface of the plurality of surfaces with the second assembly, when the first assembly and the second assembly are joined together.

2. The system of claim 1, wherein the rigid support is connected to the MEMS device via a vibration isolator.

3. The system of claim 2, wherein the at least one mount isolator and the vibration isolator are connected to each other.

4. The system of claim 1, wherein the plurality of surfaces of the rigid support comprise:
   a distal surface, wherein the distal surface is the surface of the rigid support that is farthest from the MEMS device, the distal surface encircling the MEMS device;
   a first mount isolator surface having a first segment of the at least one mount isolator formed thereon; and
   a second mount isolator surface having a second segment of the at least one mount isolator formed thereon, wherein the first mount isolator surface and the second mount isolator surface are parallel to one another and intersect opposite edges of the distal surface.

5. The system of claim 4, wherein a further segment of the at least one mount isolator is formed on the distal surface.

6. The system of claim 4, wherein the rigid support is secured between the first assembly and the second assembly through pressure applied by the first assembly on the first segment of the at least one mount isolator and pressure applied by the second assembly on the second segment of the at least one mount isolator.

7. The system of claim 6, wherein the pressure applied to the first segment of the at least one mount isolator and the second segment of the at least one mount isolator causes a portion of the first segment and the second segment to flow over a portion of the distal surface.

8. The system of claim 4, wherein an exposed portion of the rigid support that faces the first assembly and the second assembly are not in contact with the at least one mount isolator.

9. The system of claim 8, wherein the exposed portion comprises a plurality of exposed strips that are periodically located around the circumference of the rigid support, wherein an exposed strip extends around the first surface, the second surface, and the distal surface.

10. The system of claim 9, wherein a central isolator band extends around the circumference of the rigid support, where the central isolator band is in contact with a portion of the distal surface that is centrally located between the edges of the distal surface.

11. The system of claim 1, wherein the recessed groove is formed on an interior surface of the second assembly.

12. The system of claim 1, wherein the at least one mount isolator comprises at least one key portion, wherein the at least one key portion is larger than surrounding portions of the at least one mount isolator, wherein the recessed groove comprises at least one keyed section that receives the at least one key portion of the at least one mount isolator.

13. An apparatus for attenuating vibrations for a MEMS device, the apparatus comprising:
   a vibration isolator connected to and encircling the MEMS device;
   a rigid support coupled to the vibration isolator, the rigid support encircling the vibration isolator, wherein the rigid support comprises:
      a distal surface, wherein the distal surface is the surface of the rigid support that is farthest from the MEMS device, the distal surface encircling the MEMS device;
      a first mount isolator surface having a first segment of at least one mount isolator formed thereon, wherein the at least one mount isolator and the vibration isolator attenuate shocks and vibrations in different frequency ranges; and
      a second mount isolator surface having a second segment of the at least one mount isolator formed thereon, wherein the first surface and the second surface are parallel to one another and intersect opposite edges of the distal surface.

14. The apparatus of claim 13, wherein the at least one isolator covers a portion of the distal surface.

15. The apparatus of claim 13, wherein the at least one mount isolator is formed from an elastomeric material.

16. The apparatus of claim 13, wherein an exposed portion of the first surface, the second surface, and the distal surface are not in contact with the at least one isolator.

17. The apparatus of claim 13, wherein the vibration isolator connects to the MEMS device via an inner member that encircles the MEMS device.

18. A method for attenuating vibration for a MEMS device, the method comprising:
   locating the MEMS device within a rigid support, wherein a plurality of surfaces of the rigid support are in contact with at least one mount isolator;
   placing the MEMS device and the rigid support within a groove formed in a second assembly;
   joining the second assembly to a first assembly, wherein both the first assembly and the second assembly apply pressure to different surfaces of the at least one mount isolator such that the location of the rigid support is secured with respect to the joined first assembly and second assembly.

19. The method of claim 18, further comprising adjusting at least one of the hardness, thickness, and contact area of the at least one mount isolator to attenuate frequencies within a certain frequency range.

20. The method of claim 19, wherein the at least one mount isolator attenuates frequencies greater than 2000 Hz.

* * * * *